(12) United States Patent
Jin

(10) Patent No.: US 8,119,454 B2
(45) Date of Patent: Feb. 21, 2012

(54) MANUFACTURING FAN-OUT WAFER LEVEL PACKAGING

(75) Inventor: Yonggang Jin, Singapore (SG)

(73) Assignee: STMicroelectronics Asia Pacific Pte Ltd., Singapore (SG)

( * ) Notice: Subject to any disclaimer, the term of this patent is extended or adjusted under 35 U.S.C. 154(b) by 187 days.

(21) Appl. No.: 12/330,044

(22) Filed: Dec. 8, 2008

(65) Prior Publication Data

US 2010/0140788 A1 Jun. 10, 2010

(51) Int. Cl.
*H01L 21/00* (2006.01)
*H01L 21/44* (2006.01)
*H01L 21/4763* (2006.01)

(52) U.S. Cl. ............... 438/118; 257/E21.507; 438/613; 438/637

(58) Field of Classification Search ............ 438/118, 438/613, 637; 257/E21.507
See application file for complete search history.

(56) References Cited

U.S. PATENT DOCUMENTS

| | | | |
|---|---|---|---|
| 2005/0212129 A1* | 9/2005 | Huang et al. | 257/737 |
| 2006/0019480 A1* | 1/2006 | Cheng et al. | 438/612 |
| 2006/0030150 A1* | 2/2006 | Jiang et al. | 438/673 |
| 2007/0040264 A1* | 2/2007 | Hall et al. | 257/701 |
| 2008/0142946 A1* | 6/2008 | Yang et al. | 257/690 |
| 2008/0157316 A1* | 7/2008 | Yang | 257/685 |
| 2008/0169548 A1* | 7/2008 | Baek | 257/686 |
| 2008/0265421 A1 | 10/2008 | Brunnbauer et al. | |

* cited by examiner

*Primary Examiner* — Kevin Parendo
(74) *Attorney, Agent, or Firm* — Lisa K. Jorgenson; Harold H. Bennett, II; Seed IP Law Group PLLC

(57) ABSTRACT

Fan-out wafer level packaging includes an integrated circuit having a top surface, a bottom surface and a bond pad defined on the top surface, and a substrate having a cavity. An adhesive layer is positioned between a top surface of the cavity and the bottom surface of the integrated circuit, and a bump is positioned proximate a top surface of the fan-out wafer level packaging, the bump spaced apart from the integrated circuit. A redistribution layer is configured to electrically couple the bond pad of the integrated circuit to the bump.

11 Claims, 15 Drawing Sheets

US 8,119,454 B2

MANUFACTURING FAN-OUT WAFER LEVEL PACKAGING

BACKGROUND

1. Technical Field

This description generally relates to the field of chip packaging, and more particularly to fan-out wafer level packaging.

2. Description of the Related Art

Redistributing the bond pads of integrated circuits ("ICs") in chip packages is becoming increasingly common. In general, the redistribution process converts peripheral wire bond pads on an IC to an area array of solder bumps via a redistribution layer. The resulting fan-out wafer level packaging may have a larger solder bump bonding area and may be more easily integrated into electronic devices and larger chip packages.

Conventionally, a backside of an IC is first encapsulated in a molding compound. A plurality of dielectric layers and redistribution layers are then deposited on a front side of the IC to form electrical connections between wire bond pads on the IC and redistributed solder bump bond pads. Finally, solder bumps are formed at the redistributed bond pad locations, and the fan-out wafer level packaging is ready to be soldered to a printed circuit board.

There remains a need in the art, however, for an improved method of manufacturing fan-out wafer level packaging.

BRIEF SUMMARY

In one embodiment, a method of manufacturing fan-out wafer level packaging may be summarized as comprising: forming a cavity in a substrate; forming an adhesive layer on at least a portion of a top surface of the cavity; placing an integrated circuit having a top surface and a bond pad on the top surface within the cavity, at least a portion of a bottom surface of the integrated circuit contacting the adhesive layer; forming a redistribution layer configured to electrically couple the bond pad of the integrated circuit to a redistributed bond pad; and forming a bump at the redistributed bond pad.

In another embodiment, fan-out wafer level packaging may be summarized as comprising: an integrated circuit having a top surface, a bottom surface and a bond pad defined on the top surface; a substrate having a cavity; an adhesive layer positioned between a top surface of the cavity and the bottom surface of the integrated circuit; a bump positioned proximate a top surface of the fan-out wafer level packaging, the bump spaced apart from the integrated circuit; and a redistribution layer configured to electrically couple the bond pad of the integrated circuit to the bump.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION OF EMBODIMENTS OF THE INVENTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures and methods associated with integrated circuits and semiconductor manufacturing/packaging processes have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment.

Furthermore, the particular features, structures, or characteristics may be combined in any suitable manner in one or more embodiments.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the embodiments.

Description of an Exemplary Fan-Out Wafer Level Packaging

Figure 1:
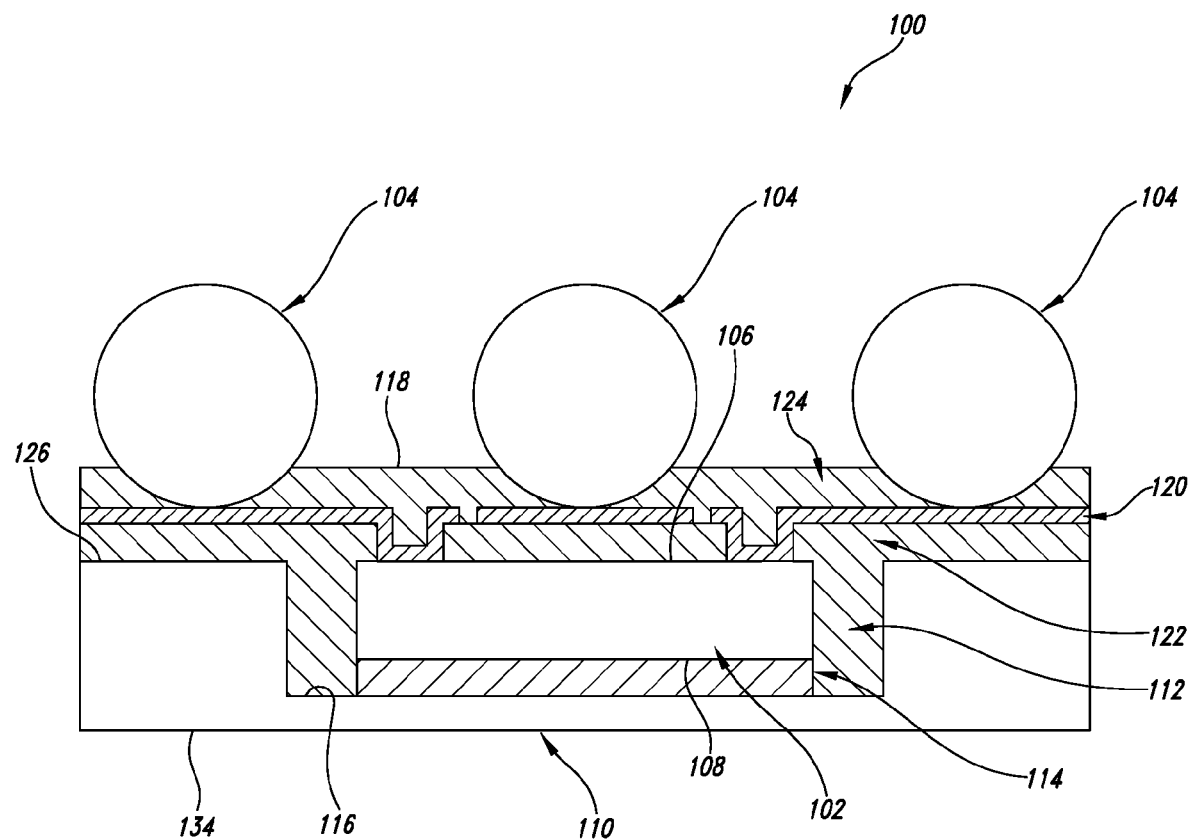
FIG. 1 is a cross-sectional, side, schematic view of fan-out wafer level packaging, according to one embodiment.

FIG. 1 shows fan-out wafer level packaging 100, according to one illustrated embodiment. The fan-out wafer level packaging 100 may be configured to protect an integrated circuit 102 from the external environment. In one embodiment, the fan-out wafer level packaging 100 includes a plurality of bumps 104 electrically coupled to the integrated circuit 102, and the fan-out wafer level packaging 100 may thus enable electrical connections to be formed between the integrated circuit 102 and external circuitry. In other embodiments, other electrically conductive structures may be formed along an external surface of the fan-out wafer level packaging 100 in order to enable such electrical connections with the integrated circuit 102.

The integrated circuit 102 may include any of a variety of electronic circuitry. For example, the integrated circuit 102 may comprise a controller for an electronic computing device, or a computer-readable memory. In different embodiments, the integrated circuit 102 may be formed using any of a variety of semiconductor fabrication processes. In one embodiment, the integrated circuit 102 is defined by layers of semi-conducting, dielectric and conducting materials deposited onto a semiconductor substrate in accordance with pre-defined patterns.

As illustrated, the integrated circuit 102 may include a top surface 106 and a bottom surface 108. Of course, the terms, top and bottom, refer only to the orientation of the respective surfaces in FIG. 1, and should not be understood to imply any absolute positioning of the integrated circuit 102. Although not visible in FIG. 1, the integrated circuit 102 may further include one or more bond pads defined on the top surface 106. The number of bond pads may vary greatly depending upon the particular application for the integrated circuit 102. For example, controller circuitry may require more bond pads defining input/outputs than memory circuitry. The bond pads may comprise any type of conducting material, such as copper, silver or gold.

The integrated circuit 102 may have any of a variety of shapes and sizes. In one embodiment, the integrated circuit 102 has a generally rectilinear top surface 106. For example, the top surface 106 may have a generally square shape. In other embodiments, more irregular shapes may define the integrated circuit 102.

The fan-out wafer level packaging 100 may further comprise a substrate 110 having a cavity 112 defined therein. The substrate 110 may comprise any of a variety of dielectric materials. In one embodiment, the substrate 110 comprises FR-4 material (similar to that used to fabricate printed circuit boards). The material comprising the substrate 110 may also be chosen to provide substantial rigidity to the fan-out wafer level packaging 100.

The substrate 110, like the integrated circuit 102, may have any of a variety of shapes and sizes. As illustrated, the substrate 110 is larger than the integrated circuit 102, such that the integrated circuit 102 may fit at least partially within the cavity 112 defined within the substrate 110. The substrate 110 may further have a generally rectilinear shape, such that the shape of the substrate 110 and the shape of the integrated circuit 102 are geometrically similar.

In one embodiment, the cavity 112 defined within the substrate 110 is substantially larger than the integrated circuit 102, such that the integrated circuit 102 may be positioned entirely within the cavity 112 (as illustrated in FIG. 1). The cavity 112 may also have a generally rectilinear shape that is geometrically similar to the shape of the top surface 106 of the integrated circuit 102. In other embodiments, the cavity 112 may define a more complex shape that generally follows the contours of the integrated circuit 102. In still other embodiments, the shapes of the cavity 112, the substrate 110 and the integrated circuit 102 may be independent and dissimilar.

As illustrated in FIG. 1, the fan-out wafer level packaging 100 may further include an adhesive layer 114 positioned between a top surface 116 of the cavity 112 and the bottom surface 108 of the integrated circuit 102. The adhesive layer 114 may comprise any of a variety of adhesive materials configured to adhere to both the integrated circuit 102 and the substrate 110. In some embodiments, the adhesive layer 114 comprises an adhesive glue, such as an epoxy. In other embodiments, other materials, such as polyimide, polybenzoxazole or solder resist, may serve as the adhesive layer 114. In still other embodiments, the adhesive layer 114 comprises double-sided tape positioned between the substrate 110 and the integrated circuit 102. For example, the double-sided tape may include a first adhesive material positioned adjacent the integrated circuit 102, and a second adhesive material positioned adjacent the substrate 110. In such an embodiment, the two different adhesive materials may be optimized to adhere to their respective surfaces. In still another embodiment, the fan-out wafer level packaging 100 may not include an adhesive layer 114, and other structures may be used to fix the integrated circuit 102 at least partially within the cavity 112.

The fan-out wafer level packaging 100 may further include one or more bumps 104 positioned proximate a top surface 118 of the fan-out wafer level packaging 100. Each of these bumps 104 is spaced apart from the integrated circuit 102, but may be electrically coupled thereto. The bumps 104 may comprise any of a variety of solder bumps formed from different materials. In one embodiment, the bumps 104 comprise lead-free solder bumps, while, in other embodiments, the bumps 104 include lead as well as other conductive materials, such as tin. Although three bumps 104 are visible in the cross-section of FIG. 1, more or fewer bumps 104 may be incorporated into the fan-out wafer level packaging 100 in different embodiments. For example, in some embodiments, at least one bump 104 may correspond to each bond pad defined on the top surface 106 of the integrated circuit 102.

The bumps 104 may also have any of a variety of sizes. In one embodiment, the bumps 104 have diameters of between 10 and 200 μm, depending upon their composition, as well as the processes used to form them.

The fan-out wafer level packaging 100 may further include a redistribution layer 120 configured to electrically couple at least one bond pad of the integrated circuit 102 to a corresponding bump 104. The redistribution layer 120 may comprise any of a variety of electrically conductive materials defining at least part of an electrical path between particular bond pads of the integrated circuit 102 and corresponding bumps 104. For example, the redistribution layer 120 may comprise copper or gold in some embodiments.

Figure 13:
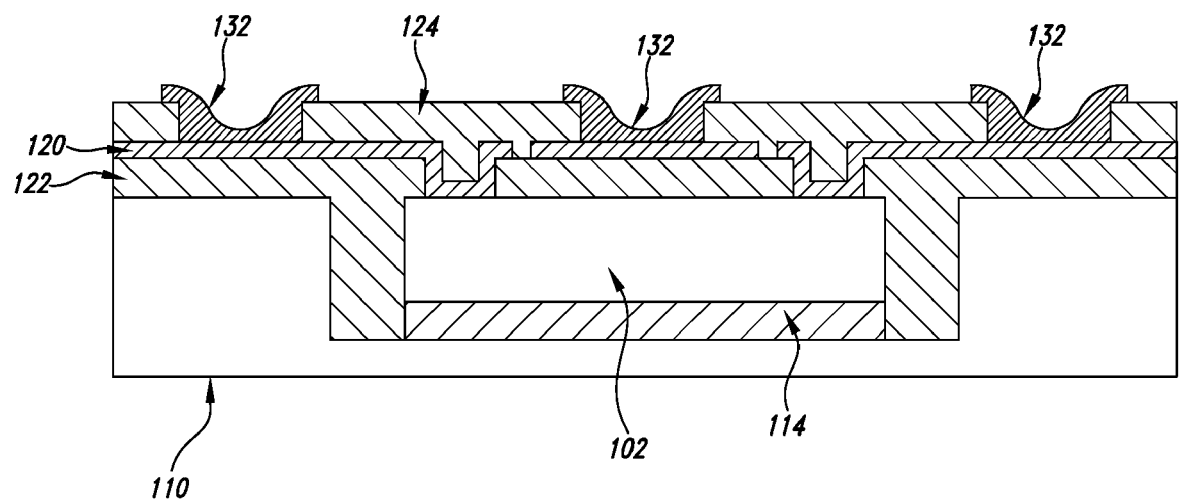
FIG. 13 is a cross-sectional, side view of a redistributed bond pad formed over at least a portion of the redistribution layer of FIG. 11, according to one embodiment.

In one embodiment, as illustrated in FIG. 1, the redistribution layer 120 itself may define redistributed bond pads (located directly underneath corresponding bumps 104), and the bumps 104 may be in direct contact with the redistribution layer 120. However, in other embodiments, redistributed bond pads may be formed atop the redistribution layer 120 (as illustrated in FIG. 13 and discussed in greater detail below), and the bumps 104 may be coupled thereto.

The redistribution layer 120 may have any of a variety of thicknesses. In one embodiment, the redistribution layer 120 may be between 1 and 10 μm thick. Such a substantial thickness may facilitate the use of the redistribution layer 120 itself as a redistributed bond pad with lead-free bumps. In other embodiments, the redistribution layer 120 may be at least 1 μm thick. In such embodiments, it may be desirable to use the redistribution layer 120 with a separate redistributed bond pad to form the final interface with a corresponding bump 104.

The fan-out wafer level packaging 100 may further include dielectric layers 122,124. Such dielectric layers 122,124 may add structural integrity to the fan-out wafer level packaging 100, while keeping conductive elements of the fan-out wafer level packaging 100 electrically insulated from one another. In one embodiment, a first dielectric layer 122 extends at least partially over the top surface 106 of the integrated circuit 102. The first dielectric layer 122 may define at least one bond pad via, through which the redistribution layer 120 may contact a corresponding bond pad of the integrated circuit 102. Two such bond pad vias are illustrated in the cross-sectional view of FIG. 1. Of course, in other embodiments, more or fewer bond pad vias may be defined. As illustrated in FIG. 1, at least a portion of the first dielectric layer 122 may also be positioned between a sidewall of the cavity 112 and an opposing sidewall of the integrated circuit 102. In fact, the sidewalls of the integrated circuit 102 may be substantially surrounded by the first dielectric layer 122 in some embodiments. The first dielectric layer 122 may also extend over substantially all of a top surface 126 of the substrate 110, as illustrated in FIG. 1.

In one embodiment, a second dielectric layer 124 extends at least partially over the redistribution layer 120. The second dielectric layer 124 may define at least one redistribution via therethrough that extends to the redistribution layer 120. Three such redistribution vias are illustrated in the cross-sectional view of FIG. 1. Of course, in other embodiments, more or fewer redistribution vias may be defined. In one embodiment, each redistribution via through the second dielectric layer 124 may correspond to exactly one bond pad via through the first dielectric layer 122.

In one embodiment, the first dielectric layer 122 and the second dielectric layer 124 comprise the same dielectric material. For example, a photosensitive polymer, such as polyimide, polybenzoxazole or solder resist, may be used to define both the first dielectric layer 122 and the second dielectric layer 124. In other embodiments, different materials may be used to define the two dielectric layers 122, 124.

The first dielectric layer 122 may have any of a variety of thicknesses. In one embodiment, the first dielectric layer 122 may be between approximately 5 and 10 μm thick, as measured from the top surface 126 of the substrate 110 to the redistribution layer 120. The second dielectric layer 122 may also be formed to define any of a variety of thicknesses. In one embodiment, a thickness of the second dielectric layer 124 may be greater than 2 μm added to a thickness of the redistribution layer 120.

Figure 2:
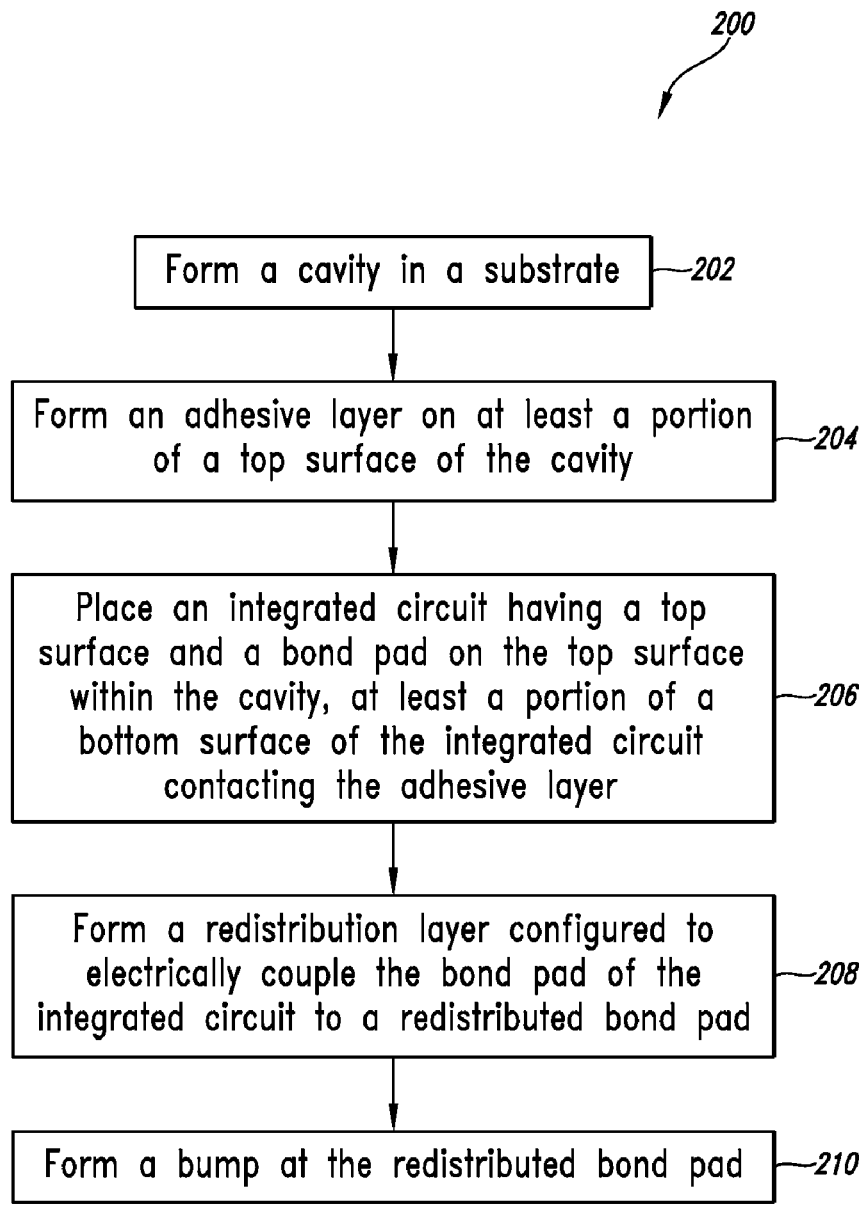
FIG. 2 is a flow chart illustrating one method of manufacturing the fan-out wafer level packaging of FIG. 1, according to one embodiment.

Description of an Exemplary Method for Manufacturing Fan-Out Wafer Level Packaging FIG. 2 illustrates a flow diagram for a method 200 of manufacturing fan-out wafer level packaging, according to one embodiment. This method 200 will be discussed in the context of the fan-out wafer level packaging 100 of FIG. 1 with reference to FIGS. 3-13, which illustrate associated structures as well as the fan-out wafer level packaging 100 at varying stages during the manufacturing process. However, it may be understood that the acts disclosed herein may also be executed to manufacture a variety of differently configured fan-out wafer level packaging, in accordance with the described method.

As described herein, all of the acts comprising the method 200 may be orchestrated by a manufacturing processor or controller based at least in part on execution of computer-readable instructions stored in memory. In other embodiments, a hardware implementation of all or some of the acts of method 200 may be used.

Figure 3:
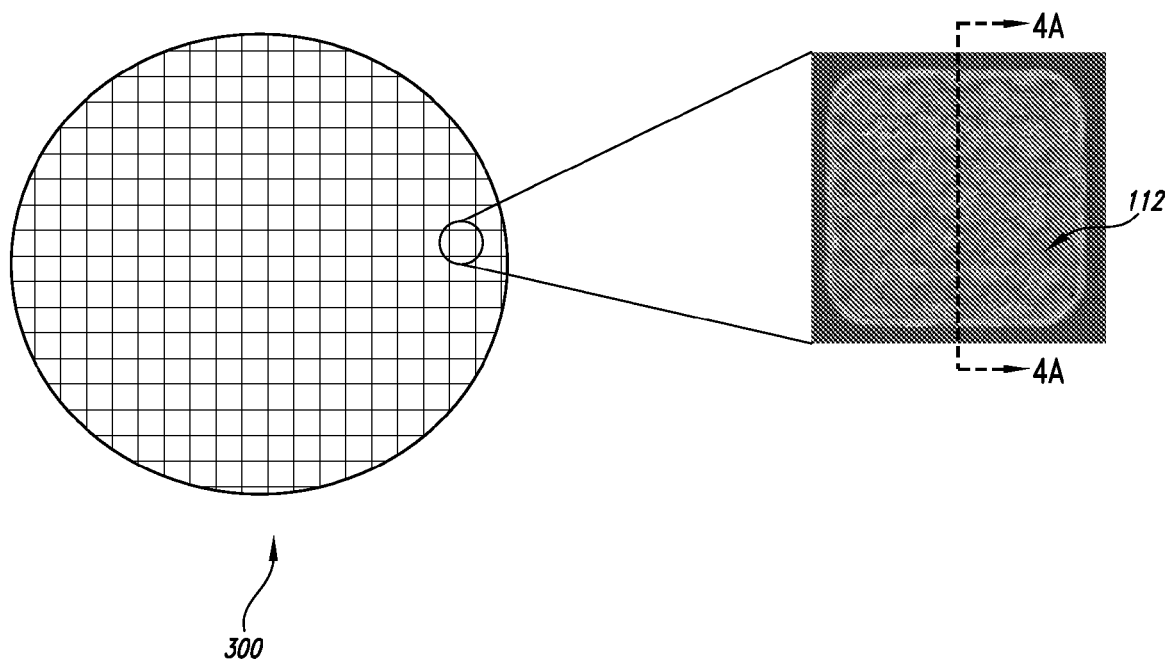
FIG. 3 is a top view of a substrate wafer including a plurality of cavities, including an enlarged top view of one of the cavities, according to one embodiment.

The method begins at 202, when a cavity 112 is formed in a substrate 110. The substrate 110 may comprise any of a variety of substrates. In one embodiment, as illustrated in FIG. 3, a unitary wafer 300 of substrate material is provided. The wafer 300 may comprise any of a variety of dielectric materials. As illustrated, the wafer 300 may be processed to form a plurality of cavities 112. In one embodiment, the plurality of cavities 112 are milled simultaneously in the unitary piece of substrate material. In another embodiment, each cavity 112 may be milled or otherwise formed in a separate process. In still another embodiment, a chemical etching process may be used to form the cavities 112 in the wafer 300.

After the cavities 112 have been formed, the wafer 300 may be divided (e.g., laser-cut or die sawed) to form a plurality of substrates 110. Each of these substrates 110 may then be used in the manufacture of corresponding fan-out wafer level packaging 100 in accordance with the acts described below. In another embodiment, the wafer 300 may be processed as a whole to form a plurality of unseparated fan-out wafer level packaging, before a dividing process is executed to define the final substrates 110 and separate fan-out wafer level packaging 100.

Figure 4A:
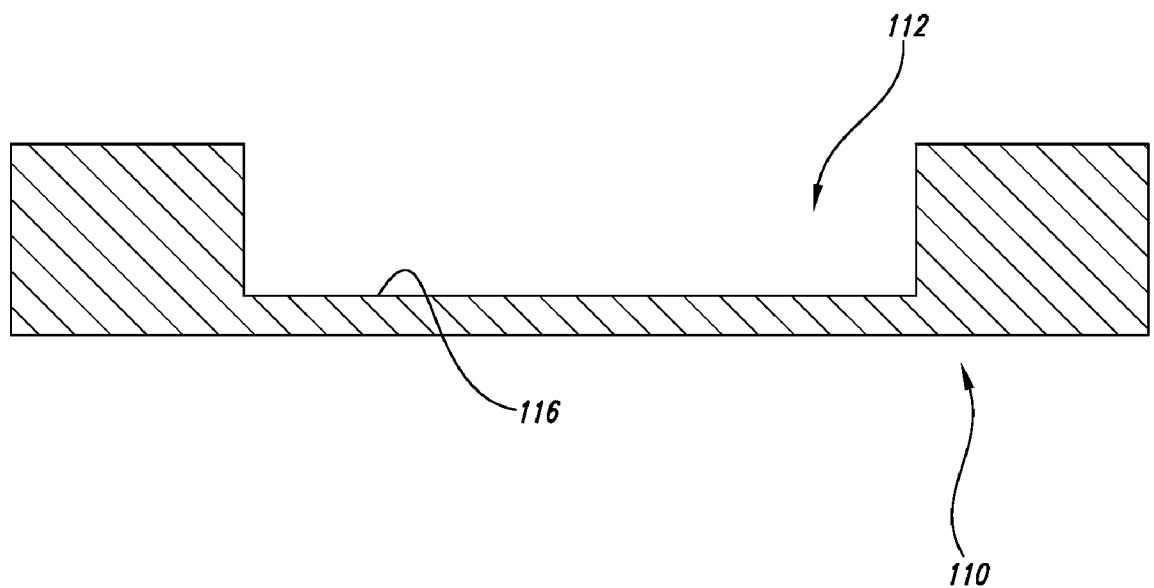
FIG. 4A is a cross-sectional, side view of one of the plurality of cavities of FIG. 3, according to one embodiment.

As illustrated in FIG. 3, each of the cavities 112 may define substantially rectilinear openings. In some embodiments, the shapes of the cavities 112 are chosen to generally correspond to a shape of corresponding integrated circuits 102. In other embodiments, the cavities 112 may define more complex shapes. With reference to FIG. 4A, a cross-sectional, side view of a substrate 110 and corresponding cavity 112 is illustrated.

Figure 4B:
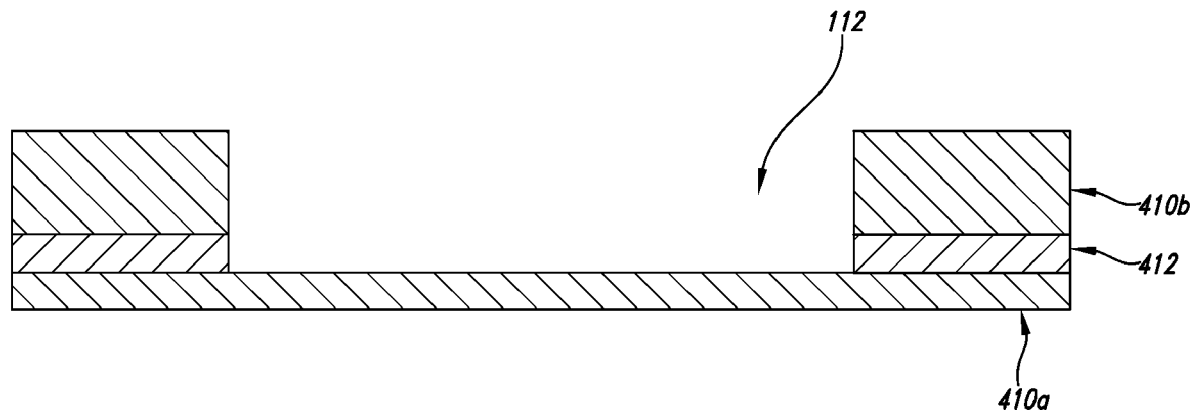
FIG. 4B is a cross-sectional, side view of a cavity formed from stacked layers of substrate material, according to one embodiment.

In other embodiments, the cavity 112 may be formed in the substrate 110 by other manufacturing processes. For example, as illustrated in FIG. 4B, multiple layers 410a, 410b of substrate material may be stacked to define the cavity 112. In one embodiment, a first layer of substrate material 410a is defined by a relatively thin wafer. A second layer of substrate material 410b may be patterned and cut (or otherwise shaped) in order to define an opening of the cavity 112. These two layers 410a, 410b may then be coupled together via at least one adhesive layer 412 interposed therebetween. Thus, the substrate 110 may comprise one or more components coupled together to form the cavity 112.

Figure 5:
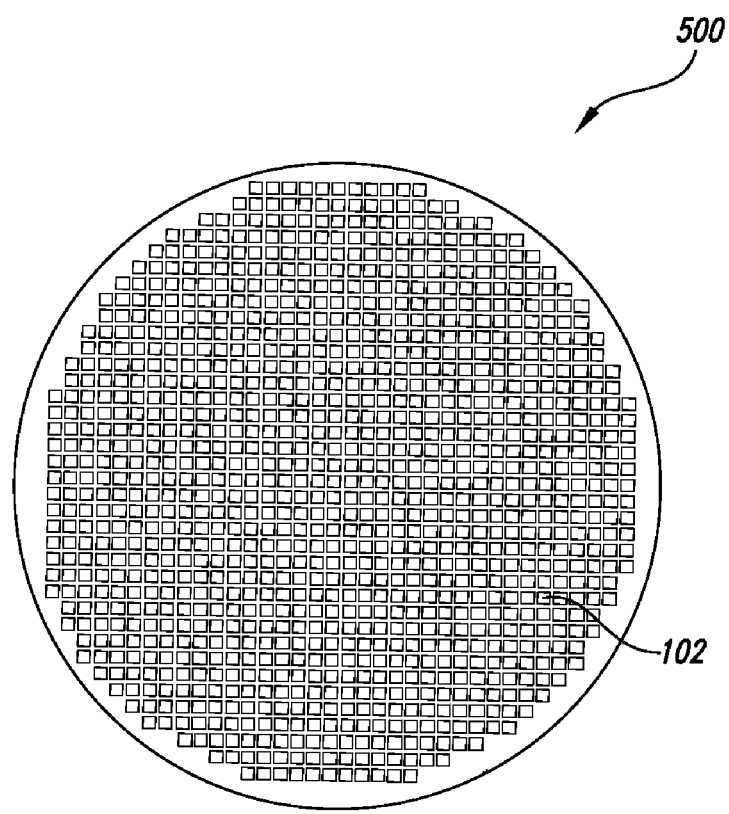
FIG. 5 is a top view of a wafer including a plurality of integrated circuits, according to one embodiment.

Integrated circuits 102 may also be formed by any of a variety of manufacturing processes. In one embodiment, as illustrated in FIG. 5, a wafer 500 including a plurality of integrated circuits 102 is provided. The wafer 500 may be processed in accordance with a variety of semiconductor processing techniques to form the integrated circuits 102, and, in one embodiment, each of the integrated circuits 102 defined within the wafer 500 may be similarly configured. The wafer 500 may then be divided (e.g. by laser-cutting or die sawing) to define the individual integrated circuits 102.

Although illustrated as round, the wafer 500 may also comprise a square panel ranging in size from 8"×8" up to 12"×12".

At act 204, an adhesive layer 114 is formed on at least a portion of a top surface 116 of the cavity 112. As described above, the adhesive layer 114 may comprise any of a variety of adhesive materials, such as double-sided tape or adhesive glue.

Figure 6:
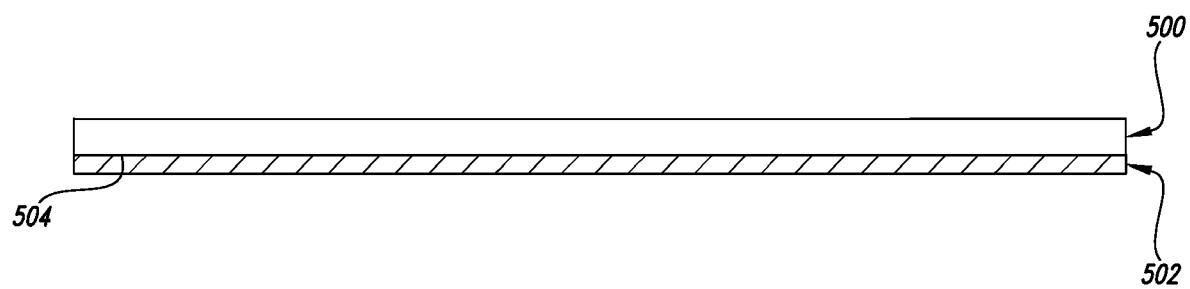
FIG. 6 is a cross-sectional, side view of the wafer of FIG. 5, with adhesive tape affixed to a bottom of the wafer, according to one embodiment.
Figure 7:
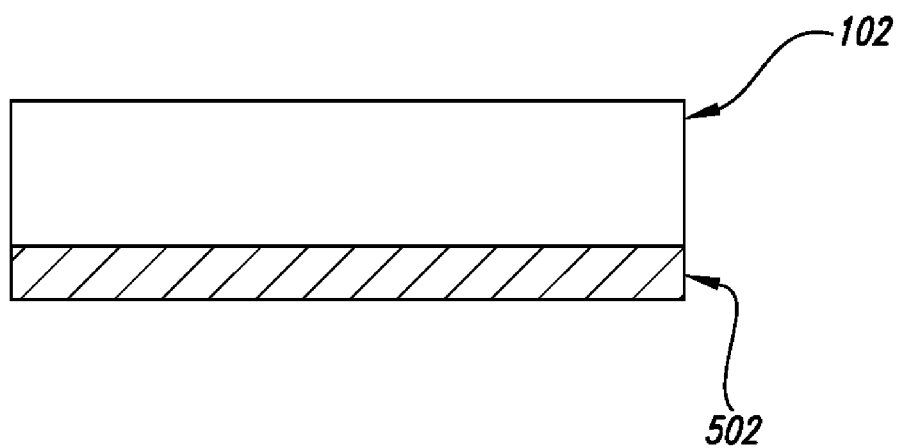
FIG. 7 is a cross-sectional, side view of one of the integrated circuits of the wafer of FIG. 6 after a dicing process, according to one embodiment.

In one embodiment, as illustrated in the cross-sectional, side view of FIG. 6, double-sided tape 502 may first be affixed to a bottom surface 504 of the wafer 500. In such an embodiment, the double-sided tape 502 may thus be affixed to respective bottom surfaces 108 of each integrated circuit 102 before the integrated circuits 102 are placed within their respective cavities 112. The wafer 500 and the double-sided tape 502 may then be cut in a single process in order to define the integrated circuits 102 and corresponding pieces of double-sided tape 502, as illustrated in FIG. 7.

Figure 8:
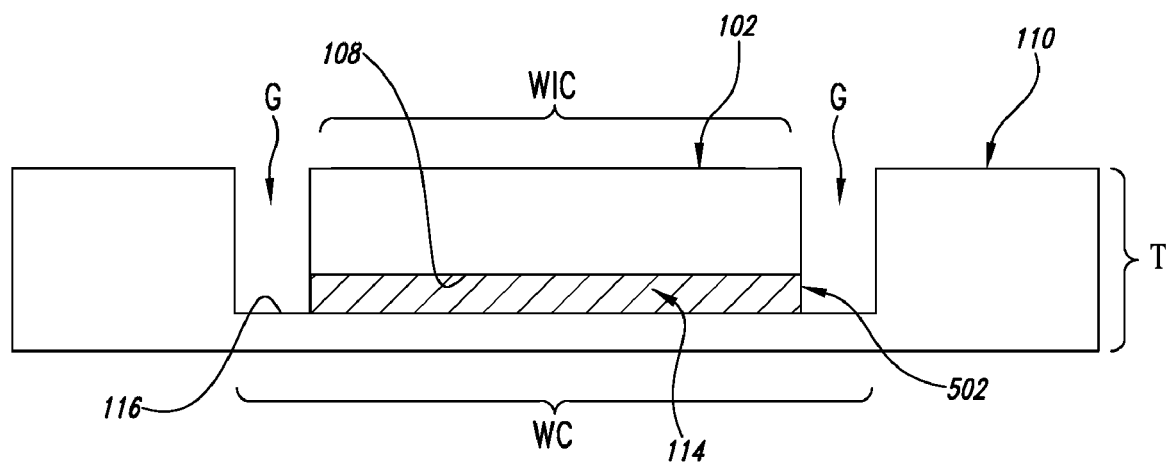
FIG. 8 is a cross-sectional, side view of the integrated circuit of FIG. 7 placed within the cavity of FIG. 4A, according to one embodiment.

When double-sided tape 502 has been thus adhered to the bottom of each integrated circuit 102, forming the adhesive layer 114 may include placing the double-sided tape 502 into the cavity 112 with the integrated circuit 102, as illustrated in FIG. 8. The double-sided tape 502 may then form the adhesive layer 114 interposed between the integrated circuit 102 and the top surface 116 of the cavity 112.

Figure 9A:
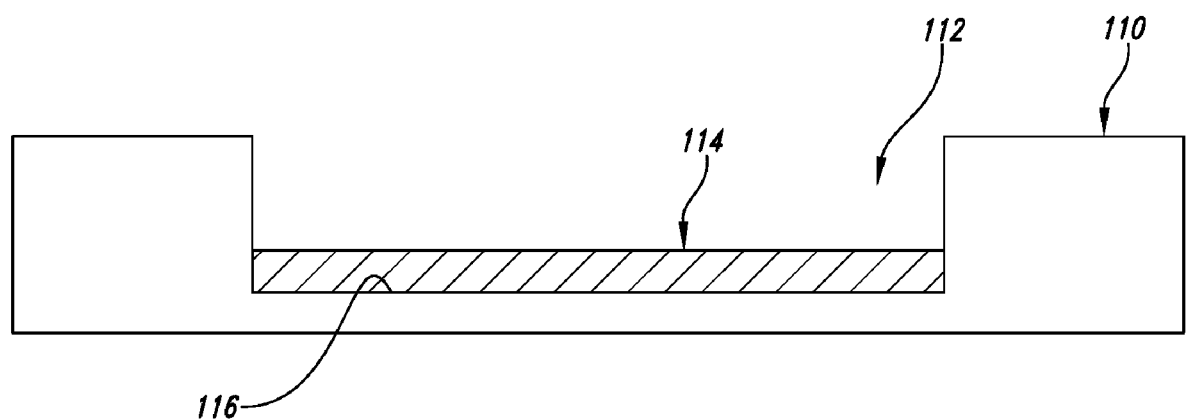
FIG. 9A is a cross-sectional, side view of the cavity of FIG. 4A partially filled with an adhesive glue, according to one embodiment.

In another embodiment, as illustrated in FIG. 9A, the adhesive layer 114 may be formed within the cavity 112 by depositing adhesive glue on the top surface 116 of the cavity 112. This adhesive glue may be deposited within the cavity 112 in a variety of ways, including by injection, sputtering, etc.

Figure 10:
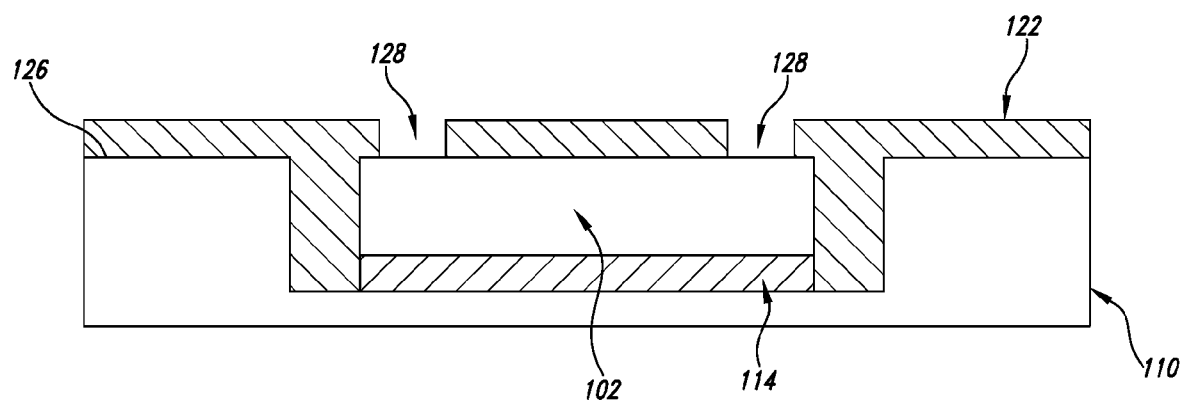
FIG. 10 is a cross-sectional, side view of a first dielectric layer formed over at least a portion of the integrated circuit and cavity of FIG. 8, according to one embodiment.

As may be seen most clearly in FIG. 8, the cavity 112 may have a width WC that is substantially larger than a width WIC of the integrated circuit 102, resulting in gaps G to either side of the sidewalls of the integrated circuit 102. In one embodiment, a ratio of a thickness T of the substrate 110 to a difference between the width WC of the cavity 112 and the width WIC of the integrated circuit 102 may be greater than or equal to ¼. Such a ratio may facilitate later acts associated with filling the gaps G with the first dielectric layer 122, as illustrated in FIG. 10. In other embodiments, other ratios for the thickness T of the substrate 110 to a difference between the width WC of the cavity 112 and the width WIC of the integrated circuit 102 may be employed.

At act 206, an integrated circuit 102 having a top surface 106 and a bond pad on the top surface 106 is placed within the cavity 112, at least a portion of a bottom surface 108 of the integrated circuit 102 contacting the adhesive layer 114. In one embodiment, as illustrated in FIG. 8, the double-sided tape 502 may first be affixed to the bottom surface 108 of the integrated circuit 102, and then the integrated circuit 102 and the double-sided tape 502 may be placed within the cavity 112 together.

Figure 9B:
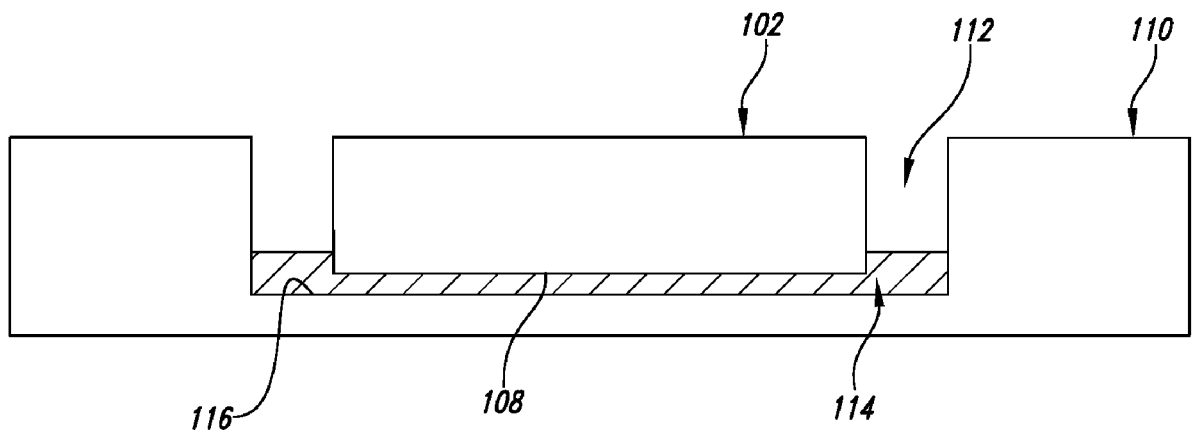
FIG. 9B is a cross-sectional, side view of an integrated circuit placed within the cavity partially filled with the adhesive glue of FIG. 9A, according to one embodiment.

In another embodiment, as illustrated in FIGS. 9A and 9B, an adhesive glue may first be deposited within the substrate 110 to form the adhesive layer 114, and then the integrated circuit 102 may be placed within the cavity 112, such that a bottom surface 108 of the integrated circuit 102 contacts the adhesive layer 114. As illustrated, as the integrated circuit 102 is placed within the cavity 112, some of the adhesive glue may be pushed up between the sidewalls of the integrated circuit 102 and the cavity 112.

The integrated circuit 102 may be placed within the cavity 112 in a variety of ways. For example, in one embodiment, a robotic end effector may be used to properly position the integrated circuit 102 relative to an opening of the cavity 112, before the integrated circuit 102 is placed therein. In another embodiment, a human operator may place the integrated circuit 102 within the cavity 112 manually or by a user-controlled machine. As illustrated, placing the integrated circuit 102 within the cavity 112 may include passing the integrated circuit 102 through an opening in the substrate 110 into the cavity 112. The alignment of the integrated circuit 102 within the cavity 112 may be relatively tightly controlled in some manufacturing processes, and vision systems or other mechanisms for controlling this alignment may be used. In one embodiment, the integrated circuit 102 is positioned so as to be substantially centered within the cavity 112.

In one embodiment, the top surface 106 of the integrated circuit 102 and the top surface 126 of the substrate 110 are substantially aligned as illustrated in the Figures. However, in other embodiments, the integrated circuit 102 may extend beyond the opening in the substrate 110, or the top surface 106 of the integrated circuit 102 may be positioned well within the cavity 112.

Once the integrated circuit 102 has been placed within the cavity 112, additional chemical, physical or thermal processing may be carried out to cure or harden the adhesive layer 114. For example, the partially formed fan-out wafer level packaging 100 of FIG. 9B may be baked to harden the adhesive layer 114.

In one embodiment, as illustrated in FIG. 10, a first dielectric layer 122 may be formed extending at least partially over the top surface 106 of the integrated circuit 102. The first dielectric layer 122 may be formed to include at least one bond pad via 128 through which at least a portion of a bond pad of the integrated circuit 102 is exposed. These bond pad vias 128 may enable subsequent electrical connections to be formed between the bond pads of the integrated circuit 102 and one or more redistributed bond pads.

As described above, the first dielectric layer 122 may comprise any of a variety of dielectric materials. In one embodiment, the first dielectric layer 122 comprises a photosensitive polymer, such as polyimide, polybenzoxazole or solder resist.

The first dielectric layer 122 may also be deposited and then patterned to form the bond pad vias 128 by any of a variety of processes. If the first dielectric layer 122 comprises a photosensitive polymer, the photosensitive polymer may first be coated over the substrate 110 and integrated circuit 102. As illustrated in FIG. 10, the first dielectric layer 122 may thus cover substantially all of the top surface 126 of the substrate 110, and fill the side gaps G between the sidewalls of the cavity 112 and opposing sidewalls of the integrated circuit 102. After this coating, in some embodiments, the first dielectric layer 122 is planarized. Portions of the first dielectric layer 122 may then be exposed to light (e.g., to ultraviolet light) to create a desired patterning in this layer 122. After the light exposure, the exposed portions of the first dielectric layer 122 may then be removed by application of a developer solvent if a positive photosensitive polymer is used, or the unexposed portions may be removed if a negative photosensitive polymer is used. Of course, in other embodiments, other patterning processes may be used. For example, a separate photoresist layer may be deposited on top of the first dielectric layer 122 in order to define and then transfer a desired pattern to the first dielectric layer 122.

Additional chemical, physical or thermal processing may be carried out to cure or harden the first dielectric layer 122. For example, the partially formed fan-out wafer level packaging 100 of FIG. 10 may be baked to cure the first dielectric layer 122.

Figure 11:
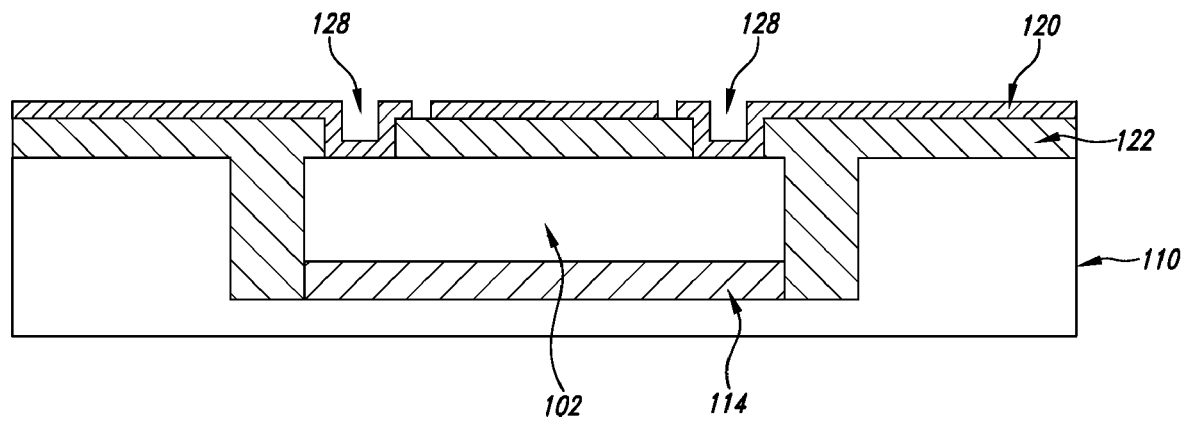
FIG. 11 is a cross-sectional, side view of a redistribution layer formed over at least a portion of the first dielectric layer of FIG. 10, according to one embodiment.

At act 208, a redistribution layer 120 configured to electrically couple the bond pad of the integrated circuit 102 to a redistributed bond pad is formed. The redistribution layer 120 may comprise any of a variety of electrically conductive materials, as discussed above. As illustrated in FIG. 11, the redistribution layer 120 may be formed over at least a portion of the first dielectric layer 122 and may fill at least partially the bond pad via 128. Thus, the redistribution layer 120 may create electrical connections between the bond pads of the integrated circuit 102 and one or more redistributed bond pads through the bond pad vias 128.

In one embodiment, after the first dielectric layer 122 has been formed, a seed layer (not shown) may first be sputtered over the first dielectric layer 122. The seed layer may comprise a metallic thin film, such as copper. This seed layer may thus extend over the entire exposed surface of the partially formed fan-out wafer level packaging 100 of FIG. 10. A patterned layer may then be formed over the seed layer using photolithography. Any of a variety of photolithographic techniques may be used to form such a patterned layer over the seed layer. The patterned layer may comprise, for example, photoresist material. The patterned layer may leave portions of the seed layer exposed in a pattern that will eventually define the pattern of the redistribution layer 120. At least a portion of the seed layer exposed through the patterned layer may then be plated to form the redistribution layer 120. For example, electrochemical plating or electroless plating may be performed to create a copper redistribution layer 120. The patterned layer may then be removed, and the remaining portions of the seed layer that were not plated may also be removed. Any of a variety of chemical or physical processes, such as wet etching, may be used to remove these layers, leaving the patterned redistribution layer 120. Of course, in other embodiments, other techniques for forming a patterned redistribution layer 120 may be used.

Figure 12:
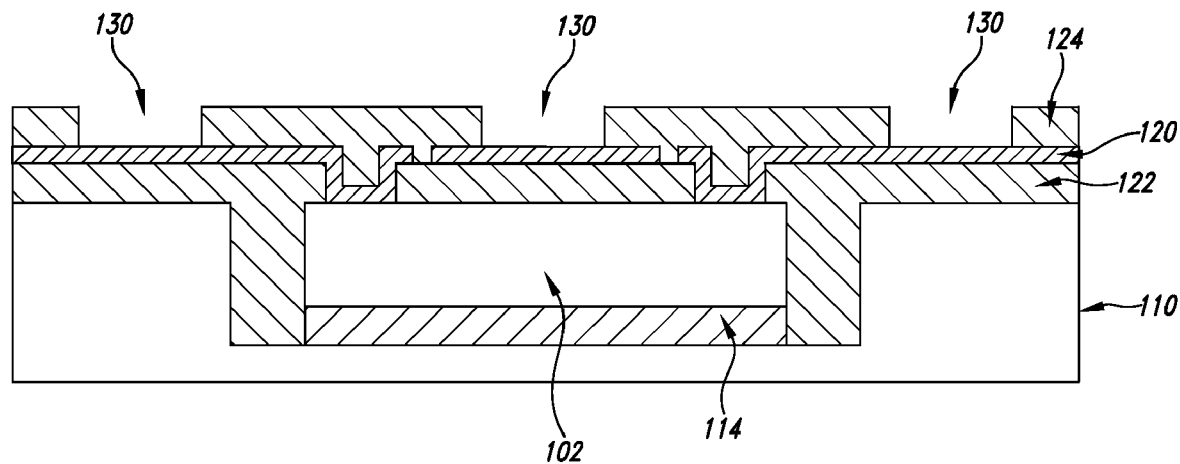
FIG. 12 is a cross-sectional, side view of a second dielectric layer formed over at least a portion of the redistribution layer of FIG. 11, according to one embodiment.

As illustrated in FIG. 12, once the redistribution layer 120 has been formed, a second dielectric layer 124 may be formed extending at least partially over the redistribution layer 120 and including at least one redistribution via 130 through which at least a portion of the redistribution layer 120 is exposed. These redistribution vias 130 may define the locations for one or more redistributed bond pads. As described above, in one embodiment, the redistribution layer 120 may itself define the redistributed bond pads. In other embodiments, a redistributed bond pad may be formed at least partially within a corresponding redistribution via 130, as described in greater detail below with respect to FIG. 13.

As described above, the second dielectric layer 124 may comprise any of a variety of dielectric materials. In one embodiment, the second dielectric layer 124 and the first dielectric layer 122 comprise the same material. For example, the second dielectric layer 124 may comprise a photosensitive polymer, such as polyimide, polybenzoxazole or solder resist.

The second dielectric layer 124 may be deposited and then patterned to form the redistribution vias 130 in a variety of ways. If the second dielectric layer 124 comprises a photosensitive polymer, the photosensitive polymer may first be coated over the redistribution layer 120 and exposed portions of the first dielectric layer 122. After this coating, in some embodiments, the second dielectric layer 124 is planarized. Portions of the second dielectric layer 124 may then be exposed to light (e.g., to ultraviolet light) to create the desired patterning in this layer 124. After the light exposure, the exposed portions of the second dielectric layer 124 may then be removed by application of a developer solvent if a positive photosensitive polymer is used, or the unexposed portions may be removed if a negative photosensitive polymer is used. Of course, in other embodiments, other patterning processes may be used. For example, a separate photoresist layer may be deposited on top of the second dielectric layer 124 in order to define and then transfer a desired pattern to the second dielectric layer 124.

Additional chemical, physical or thermal processing may be carried out to cure or harden the second dielectric layer 124. For example, the partially formed fan-out wafer level packaging 100 of FIG. 12 may be baked to cure the second dielectric layer 124.

At act 210, a bump 104 is formed at the redistributed bond pad. The bump 104 may comprise any of a variety of conductive materials, as described above. In one embodiment, the bump 104 may comprise a lead-free bump, although in other embodiments leaded bumps may be used.

In one embodiment, the redistributed bond pad may simply be defined by the portions of the redistribution layer 120 exposed through the redistribution vias 130, as illustrated in FIG. 12. In such an embodiment, the bumps 104 may be formed by conventional ball bonding techniques in direct contact with the redistribution layer 120. Thus, the bumps 104 may be formed on the partially formed fan-out wafer level packaging 100 of FIG. 12 to form the completed fan-out wafer level packaging 100 of FIG. 1.

In other embodiments, after forming the second dielectric layer 124, a redistributed bond pad 132 may be formed at least partially within the redistribution via 130, as illustrated in FIG. 13. Such a redistributed bond pad 132 may comprise an under-bump-metallurgy layer configured to facilitate the electrical connection formed between the bump 104 and the redistribution layer 120. This redistributed bond pad 132 may be formed by a variety of processes. In one embodiment, the redistributed bond pad 132 may be formed by sputtering a compound of either: (a) titanium, nickel and copper, or (b) aluminum, nickel and copper. The sputtered compound may then be plated with a compound of either: (a) titanium and copper, (b) titanium, tungsten and copper, or (c) chromium and copper. In another embodiment, the redistributed bond pad 132 may be formed by plating the exposed redistribution layer 120 with at least one of: (a) copper, (b) nickel, or (c) copper and nickel.

The completed fan-out wafer level packaging 100 is illustrated in FIG. 1. In one embodiment, the fan-out wafer level packaging 100 may be coupled to one or more additional chip packages or electronic devices via the bumps 104. In other embodiments, one or more additional vias may be formed through the substrate 110 in order to form additional electrical connections on a bottom surface 134 of the substrate 110. That is, these vias may extend through the substrate 110 and the first dielectric layer 122 in some embodiments in order to connect an electrical line passing through the substrate 110 with the redistribution layer 120. Bond pads on the top surface 106 of the integrated circuit 102 may thus be electrically coupled to one or more additional bond pads proximate the bottom surface 134 of the substrate 110.

The foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more programs executed by one or more processors, as one or more programs executed by one or more controllers (e.g., microcontrollers), as firmware, or as virtually any combination thereof, and that designing the circuitry and/or writing the code for the software and or firmware would be well within the skill of one of ordinary skill in the art in light of this disclosure.

When logic is implemented as software and stored in memory, one skilled in the art will appreciate that logic or information can be stored on any computer readable storage medium for use by or in connection with any processor-related system or method. In the context of this document, a memory is a computer readable storage medium that is an electronic, magnetic, optical, or other physical device or means that contains or stores a computer and/or processor program and/or data or information. Logic and/or the information can be embodied in any computer readable storage medium for use by or in connection with an instruction execution system, apparatus, or device, such as a computer-based system, processor-containing system, or other system that can fetch the instructions from the instruction execution system, apparatus, or device and execute the instructions associated with logic and/or information.

The various embodiments described above can be combined to provide further embodiments. From the foregoing it will be appreciated that, although specific embodiments have been described herein for purposes of illustration, various modifications may be made without deviating from the spirit and scope of the teachings. Accordingly, the claims are not limited by the disclosed embodiments.

I claim:

1. A method of manufacturing a fan-out wafer level package, the method comprising:
    forming a cavity in a substrate, the cavity having an opening, sidewalls, and a top surface;
    affixing double-sided tape to at least a portion of a bottom surface of an integrated circuit, wherein there is a bond pad on a top surface of the integrated circuit;
    placing the integrated circuit having the double-sided tape within the opening of the cavity and forming gaps between the sidewalls of the cavity and adjacent sidewalls of the double-sided tape, wherein at least a portion of the double-sided tape contacts at least a portion of the top surface of the cavity in a central region of the cavity, and wherein the sidewalls of the cavity are spaced from the adjacent sidewalls of the double-sided tape;
    forming a first dielectric layer that covers substantially all of a top surface of the substrate and that fills the gaps between the sidewalls of the cavity and the adjacent sidewalls of the double-sided tape;
    forming a redistribution layer over at least a portion of the first dielectric layer, wherein the redistribution layer is configured to electrically couple the bond pad of the integrated circuit to a redistributed bond pad; and
    forming a bump at the redistributed bond pad.

2. The method of claim 1, wherein affixing the double-sided tape to the bottom surface of the integrated circuit comprises affixing the double-sided tape to the bottom surface of the integrated circuit before placing the integrated circuit within the cavity.

3. The method of claim 1, wherein the double-sided tape comprises a first adhesive material for affixing to the bottom surface of the integrated circuit and a second adhesive material for affixing to the top surface of the cavity, wherein the double-sided tape comprises a width that is substantially equal to a width of the bottom surface of the integrated circuit.

4. The method of claim 1, wherein the first dielectric layer includes a bond pad via through which at least a portion of the bond pad is exposed.

5. The method of claim 4, wherein forming the redistribution layer includes filling at least partially the bond pad via with a portion of the redistribution layer.

6. The method of claim 4, wherein forming the redistribution layer includes:
    sputtering a seed layer over the first dielectric layer and within the bond pad via;
    forming a patterned layer over the seed layer using photolithography;
    plating at least a portion of the seed layer exposed through the patterned layer to form the redistribution layer;
    removing the patterned layer; and
    removing at least some of a remaining portion of the seed layer that is not plated.

7. The method of claim 6, wherein the redistribution layer includes the redistributed bond pad, and wherein forming the bump includes forming the bump in direct contact with the redistribution layer.

8. The method of claim 4, further comprising forming a second dielectric layer extending at least partially over the redistribution layer, the second dielectric layer including a redistribution via through which at least a portion of the redistribution layer is exposed.

9. The method of claim 8, further comprising, after forming the second dielectric layer, forming the redistributed bond pad at least partially within the redistribution via.

10. The method of claim 1, wherein a ratio of a thickness of the substrate to a difference between a width of the cavity and a width of the integrated circuit is greater than or equal to ¼.

11. The method of claim 1, wherein forming the cavity in the substrate includes stacking layers of substrate material to form the cavity, the stacking comprising forming a first layer of substrate material, forming a second layer of substrate material defining the opening of the cavity, and coupling together the first and second layers of substrate material with at least one adhesive layer interposed therebetween.

* * * * *